United States Patent
Cai et al.

(10) Patent No.: US 9,661,695 B1
(45) Date of Patent: May 23, 2017

(54) LOW-HEADROOM CONSTANT CURRENT SOURCE FOR HIGH-CURRENT APPLICATIONS

(71) Applicant: Hong Kong Applied Science & Technology Research Institute Company Limited, Hong Kong (HK)

(72) Inventors: Guangjie Cai, Hong Kong (HK); Ho Ming (Karen) Wan, Hong Kong (HK); Chun Fai Wong, Hong Kong (HK); Tai Yin Wong, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 69 days.

(21) Appl. No.: 14/939,081

(22) Filed: Nov. 12, 2015

(51) Int. Cl.
*H03F 3/04* (2006.01)
*H03F 3/30* (2006.01)
(Continued)

(52) U.S. Cl.
CPC ..... *H05B 33/0806* (2013.01); *H03K 17/6872* (2013.01); *H05B 33/0842* (2013.01); *H03F 3/45179* (2013.01); *H03F 2200/471* (2013.01)

(58) Field of Classification Search
CPC . H03F 3/08; H03F 1/301; H03F 3/345; H03F 2200/447; H03F 2200/456; H03F 2200/513; H03F 2200/91; H04B 10/6931; H03G 3/3084; H03G 3/30; G05F 3/262; H02M 3/156; H02M 2003/078;
(Continued)

(56) References Cited

U.S. PATENT DOCUMENTS 4,583,037 A    4/1986 Sooch
6,304,108 B1   10/2001 Inn
(Continued)

FOREIGN PATENT DOCUMENTS

CN   102395234 A   11/2013
CN   103618511 A   3/2014
CN    10382557 A   5/2014

OTHER PUBLICATIONS

ISR for PCT/CN/096872 Mailed Aug. 16, 2016.

*Primary Examiner* — Alexander H Taningco
*Assistant Examiner* — Renan Luque
(74) *Attorney, Agent, or Firm* — Stuart T. Auvinen; g Patent LLC

(57) ABSTRACT

A low-headroom current driver does not use an op amp or resistor. A sensing transistor having its source connected to a drain of an output transistor senses variations in an output current. The gate, source, and drain voltages of the sensing transistor are mirrored to a sense mirror transistor to control a sense current. The sense current is mirrored to a reference source transistor to generate a mirrored sense current. An error between the mirrored sense current and a fixed reference current is stored as charge on an error-storing capacitor. The stored error charge creates a negative-feedback compensation current that adjusts a gate voltage generated by a feedback-driving transistor. The adjusted gate voltage controls the gate of the output transistor to compensate for the sensed variation in output current. The sensing current is also compensated using a sense-mirror tail transistor connected to the sense mirror transistor.

20 Claims, 10 Drawing Sheets

(51) Int. Cl.
*H05B 33/08* (2006.01)
*H03K 17/687* (2006.01)
*H03F 3/45* (2006.01)

(58) Field of Classification Search
CPC ....... H02M 3/1584; H02M 2003/1566; H02M 2001/0032; H02M 2001/0003; H02M 3/1563; H02M 2001/1566; H02M 3/157; H02M 3/158; H02M 3/1588; H02M 3/07; H02M 2001/0025; H02M 2003/071; H02M 2003/072; H02M 2003/073; H03K 7/08; H03K 4/06; H03K 4/00; H03K 4/063; H03K 4/066; H03K 4/08; H03K 4/48; H03K 4/787; H03K 4/83; H03K 4/90; H03K 4/50; H03K 4/501; H03K 4/502; Y02B 70/1466
USPC ........ 323/282–288, 351, 222–226, 271–275, 323/312, 315, 316, 242, 326; 327/131–140, 175, 113–123; 331/34, 37, 331/40, 41, 111, 143, 175, 176; 330/288–290
See application file for complete search history.

(56) References Cited

U.S. PATENT DOCUMENTS

| | | | |
|---|---|---|---|
| 6,633,198 | B2 | 10/2003 | Spalding, Jr. |
| 7,598,800 | B2 | 10/2009 | Thandi et al. |
| 7,639,081 | B2 * | 12/2009 | Arakali ............... G05F 3/262 330/288 |
| 7,652,462 | B2 | 1/2010 | Wang et al. |
| 7,679,353 | B2 | 3/2010 | Noda |
| 7,750,686 | B2 | 7/2010 | Liu |
| 2006/0170404 | A1 | 8/2006 | Amrani et al. |
| 2006/0181491 | A1 | 8/2006 | Date et al. |
| 2008/0186101 | A1 * | 8/2008 | Arakali ............... G05F 3/262 330/296 |
| 2010/0277239 | A1 * | 11/2010 | Mukhopadhyay .. H03F 3/45183 330/257 |
| 2011/0298777 | A1 * | 12/2011 | Tsuchi ................ G09G 3/3275 345/211 |
| 2012/0081091 | A1 * | 4/2012 | Ito ....................... H02M 3/156 323/282 |
| 2015/0214910 | A1 * | 7/2015 | Duan .................... H02H 9/043 330/253 |

* cited by examiner

LOW-HEADROOM CONSTANT CURRENT SOURCE FOR HIGH-CURRENT APPLICATIONS

FIELD OF THE INVENTION

This invention relates to current driver circuits, and more particularly to low-headroom high-current drivers.

BACKGROUND OF THE INVENTION

Many applications require that a high current is driven to an external device. A high-current driver may be used to drive a relatively large current to a Light-Emitting Diode (LED), liquid crystal display (LCD), motor, actuator, etc. Health-care applications requiring a large current include heart-rate monitoring, SPO2 monitors, and other sensors.

FIG. 1A shows a high-current application. Current source 106 provides a large current that is switched by switch 104 to turn on and off LED 102. FIG. 1B is a waveform of the high-current switching application. The switch closes when switch voltage VSW is high. The source current switched through LED 102 pulses high when the switch is closed. Some low-power applications may save power by reducing the turn-on time. A large current may be needed to provide a rapid settling time for the source current so that the waveform is not distorted.

As semiconductor process technology improves, devices sizes shrink. These smaller devices use reduced power-supply voltages to prevent damage to the tiny devices. The lowered power-supply voltage produces a low-headroom environment for the circuit where smaller voltages are applied across transistors. The smaller voltages in a low-headroom environment produce lower currents, which is opposite of the design goal for a high-current driver circuit. Therefore careful circuit design is needed.

A traditional current driver might use a complementary metal-oxide-semiconductor (CMOS) current mirror. However, the output current varies with changes in the drain-source voltage. Cascode current mirror may be used to reduce the current variation with drain-source output voltage, but a large voltage drop occurs on a cascode transistor. In low-headroom environments, there may be insufficient available voltage drop for the cascode transistor.

When a second transistor is placed in series with a large output transistor, this second transistor also has to be large to carry the large current, increasing circuit size and cost. Also the second transistor may reduce the available voltage drop to the output transistors. Thus having one or more transistors in series with the output transistor is undesirable.

Many driver circuits use operational amplifiers (op amps). Op amps provide a quick response, but have a high gain and have high power consumption. It is thus desirable to avoid op amps in a high-current low-headroom driver circuit.

Other circuits use a resistor over a constant voltage to generate the constant current. However, the resistor's voltage drop reduces the available voltage for other transistors in the circuit, and the resistor burns power.

What is desired is a low-headroom high-current driver circuit. A current driver circuit that does not use an op amp is desirable. A current driver circuit that does not use a resistor to generate a constant current is also desirable. A driver circuit with a constant current mirror source for high-current applications in a low-headroom environment is desired.

DETAILED DESCRIPTION

The present invention relates to an improvement in low-headroom high-current circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1B:
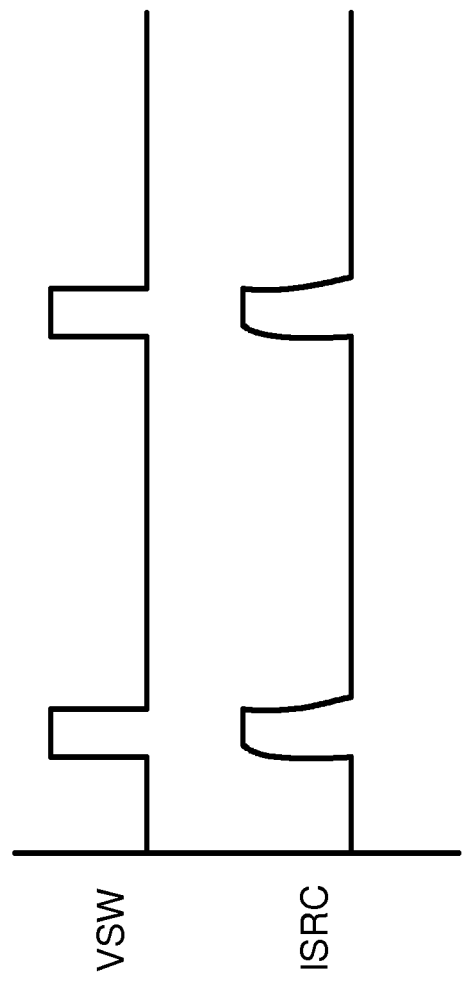
FIG. 1B is a waveform of the high-current switching application.
Figure 1A:
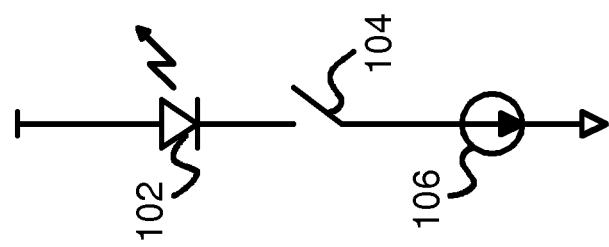
FIG. 1A shows a high-current application.
Figure 2:
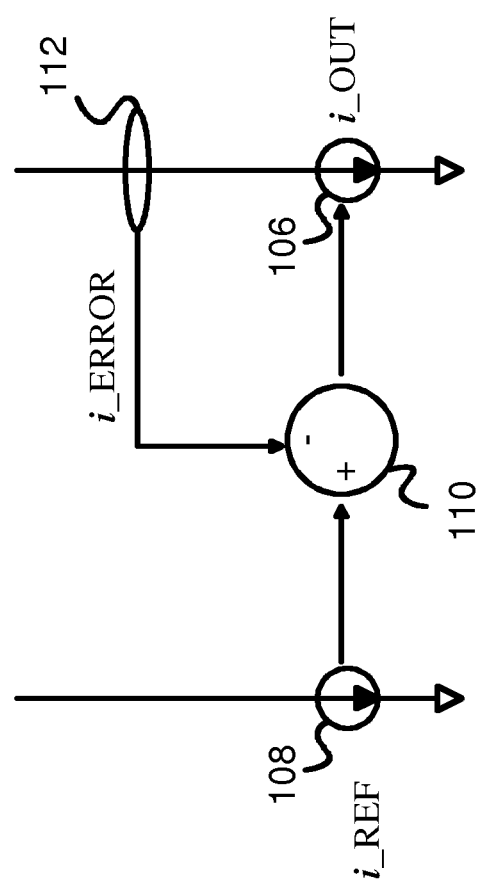
FIG. 2 is a conceptual diagram of a driver circuit that senses output-current variation to generate a compensating error current.

FIG. 2 is a conceptual diagram of a driver circuit that senses output-current variation to generate a compensating error current. Many prior designs attempt to have a mirror transistor match the gate, drain, and source voltages of the output transistor. A reference current flowing through the mirror transistor can then be scaled up by the transistor ratio to generate the output current.

In contrast, the inventors sense a variation or error in the output current. This error is used to adjust the reference current to compensate for the error. Current mirrors may still be used to scale the reference current to the output current.

A current mirror (not shown) scales a reference current i_REF from reference current source 108 to cause output current source 106 to generate output current i_OUT. Current sensing circuit 112 senses variation in the output current i_OUT from output current source 106 to generate an error current i_ERROR. Summer 110 subtracts the error current i_ERROR from the reference current i_REF to adjust generation of the output current i_OUT by output current source 106. Thus variations in output current are sensed and a compensating current generated to adjust the output current.

The closed-loop feedback of sensing output-current variation and generating a compensating current does not use an op amp. A voltage-generating resistor is also not used. Thus power consumption is reduced.

Figure 3:
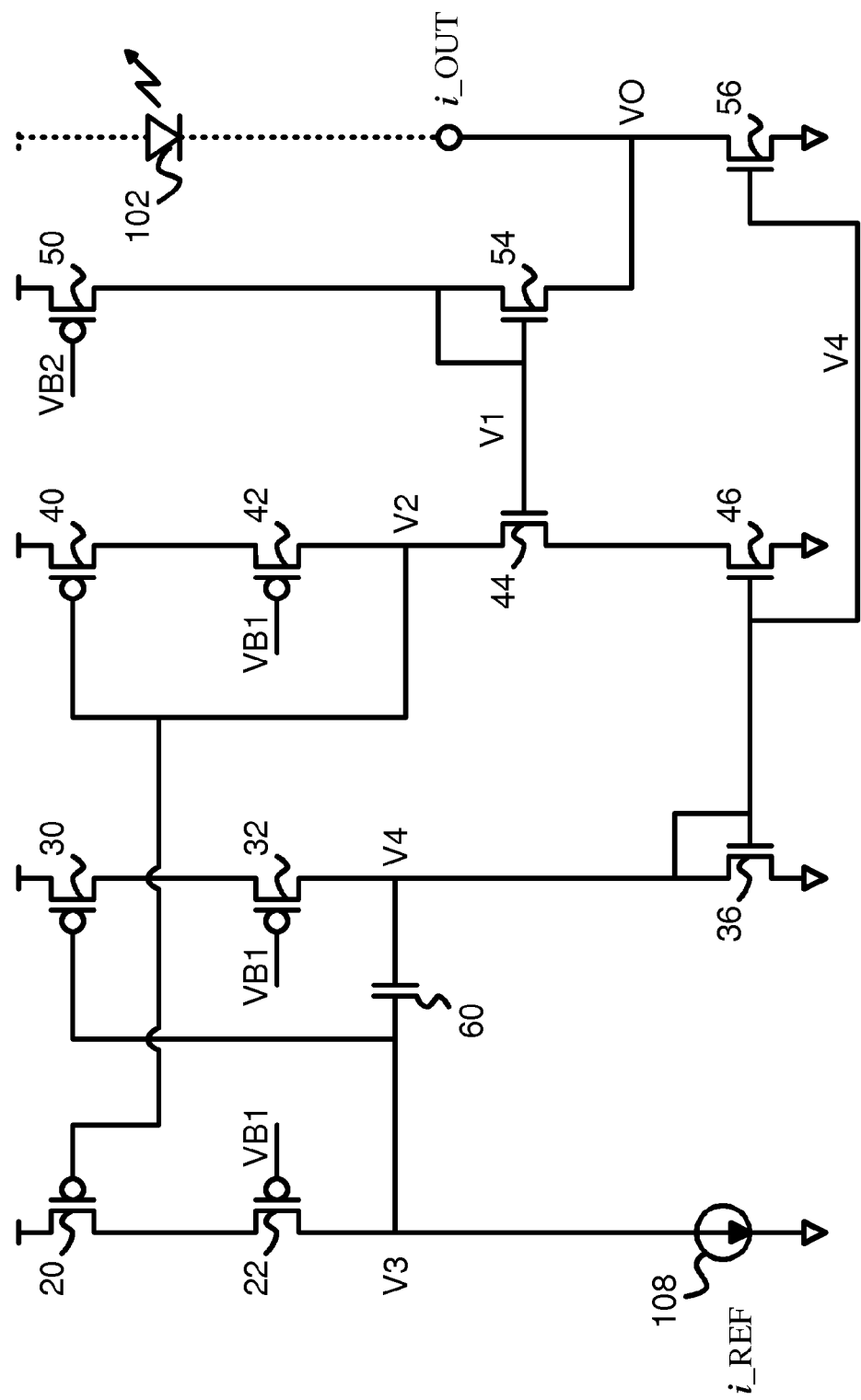
FIG. 3 is a schematic of a current-mirror circuit with sensing of output-current variation and current compensation.

FIG. 3 is a schematic of a current-mirror circuit with sensing of output-current variation and current compensation. Output transistor 56 draws output current i_OUT from output node VO and from external LED 102. Reference current source 108 sinks reference current i_REF from node V3, which is mirrored to feedback-driving transistor 36 to generate gate voltage V4 to output transistor 56. The ratio of sizes of feedback-driving transistor 36 and output transistor 56 allows i_OUT to be much larger than i_REF, since output transistor 56 is M times larger than feedback-driving transistor 36.

Variations in the output current i_OUT are sensed by transistors 50, 54, 40, 42, 44, 46. The sensed current variation is then compensated for by transistors 20, 22, 30, 32, 36. The sensed variation or error in current is stored on error-storing capacitor 60. Transistors 20, 22, 30, 32, 40, 42, 50 are p-channel transistors, while feedback-driving transistor 36, sense mirror transistor 44, sense-mirror tail transistor 46, sensing transistor 54, and sense output transistor 56 are n-channel transistors.

A first bias voltage VB1 is applied to the gates of reference middle transistor 22, feedback middle transistor 32, and sense-mirror middle transistor 42. A slightly higher second bias voltage VB2 is applied to the gate of sense-source transistor 50. The gate voltages of reference source transistor 20 and sense-mirror source transistor 40 are voltage V2 generated between the drains of sense-mirror middle transistor 42 and sense mirror transistor 44. The gate voltage V3 of feedback source transistor 30 is generated by the drain of reference middle transistor 22 as i_REF is pulled through it by reference current source 108.

Transistors 54, 44, 46 form a current sensing circuit. The current and size of transistors 54 and 44 may be the same so that their gate-to-source voltages (Vgs) are the same. Therefore, the drain voltage of transistor 46 is same as the output voltage VO. When the output voltage VO changes, the drain voltage of transistor 46 changes. Transistor 46 always senses the output current with a ratio determined by the ratio of the sizes of transistors 46, 56, since transistors 46, 56 have the same gate/source/drain voltages.

Sensing transistor 54 has its source connected to output VO. The size of sensing transistor 54 is much smaller than output transistor 56, so that a very small or negligible amount of output current i_OUT is diverted through sensing transistor 54. The current through output transistor 56 is approximately equal to i_OUT since the current through sensing transistor 54 is small.

The output voltage VO variations sensed by sensing transistor 54 cause V1 to vary. V1 is applied to the gate of sense mirror transistor 44, which causes the drain voltage of sense-mirror tail transistor 46 to vary. Voltage V2 also varies as the current through sense-mirror tail transistor 46 is varied due to its changing drain voltage. Transistor 40 has the same current as transistor 46. V2 varies and is applied to the gate of reference source transistor 20. The current of transistor 20 is same as the current of transistor 40 (assuming the sizes of transistors 20, 40 are the same, and that the sizes of transistors 22, 42 are the same). They form a cascode current mirror source.

The current sourced into node V3 is varied and stored on error-storing capacitor 60 since i_REF is fixed by reference current source 108. The size of error storing capacitor 60 can be selected to provide a desired amount of smoothing or averaging of current-variation adjustments due to an R-C time constant. Capacitor 60 can be used as current error-storing to form a voltage, and it is also used as the compensation capacitor for the feedback current source transistor 30.

The error charge stored on error-storing capacitor 60 adjusts V3 and V4, causing a feedback current through feedback source transistor 30, 32, and into feedback-driving transistor 36 to adjust V4, the gate and drain voltage of feedback-driving transistor 36 and the gate voltage of output transistor 56. The error current sensed by sensing transistor 54 is subtracted from the output current to adjust the output current through output transistor 56 back to a constant, stable value. Thus the output current through output transistor 56 is adjusted back to a constant, stable value to compensate for sensed variations by sensing transistor 54. The small current from sensing transistor 54 also helps to settle changes in i_OUT faster.

Figure 4A:
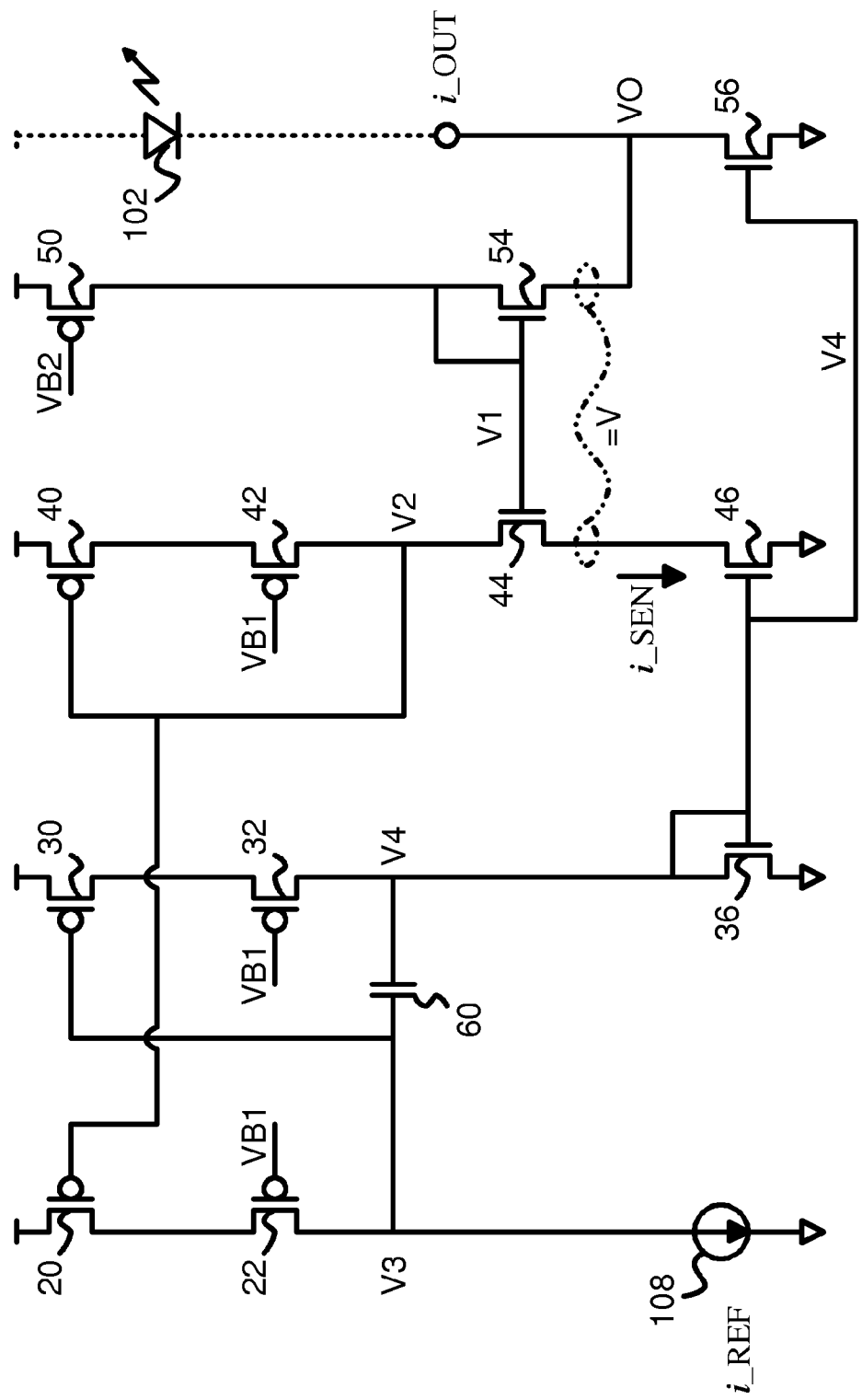
FIGS. 4A-E highlight operation of the sensing and compensating circuit of FIG. 3.

FIGS. 4A-E highlight operation of the sensing and compensating circuit of FIG. 3. In FIG. 4A, when the current through output transistor 56 suddenly increases, its drain voltage VO drops slightly. The current of transistor 54 is constant because its current is from transistor 50. The constant current causes Vgs to remain constant. When voltage VO changes suddenly or slowly, V1 is always higher than VO by one Vgs. Sense mirror transistor 44 receives V1 on its gate and causes its source voltage, which is also the drain voltage of sense-mirror tail transistor 46, to always be equal to VO. A rise in V1 increases the sense current i_SEN through sense mirror transistor 44. Thus sense-mirror tail transistor 46 always senses the output current.

When additional parallel LED's are suddenly connected to VO and draw a surge in current, the output voltage VO is pulled high suddenly. The output current increases suddenly, so the sense current of sense-mirror tail transistor 46 also increases. Using transistors 44, 54 to force the drain voltage of transistor 46 to be equal to VO, limits VO to be no higher than VDD minus one Vgs and two Vdsat.

Figure 4B:
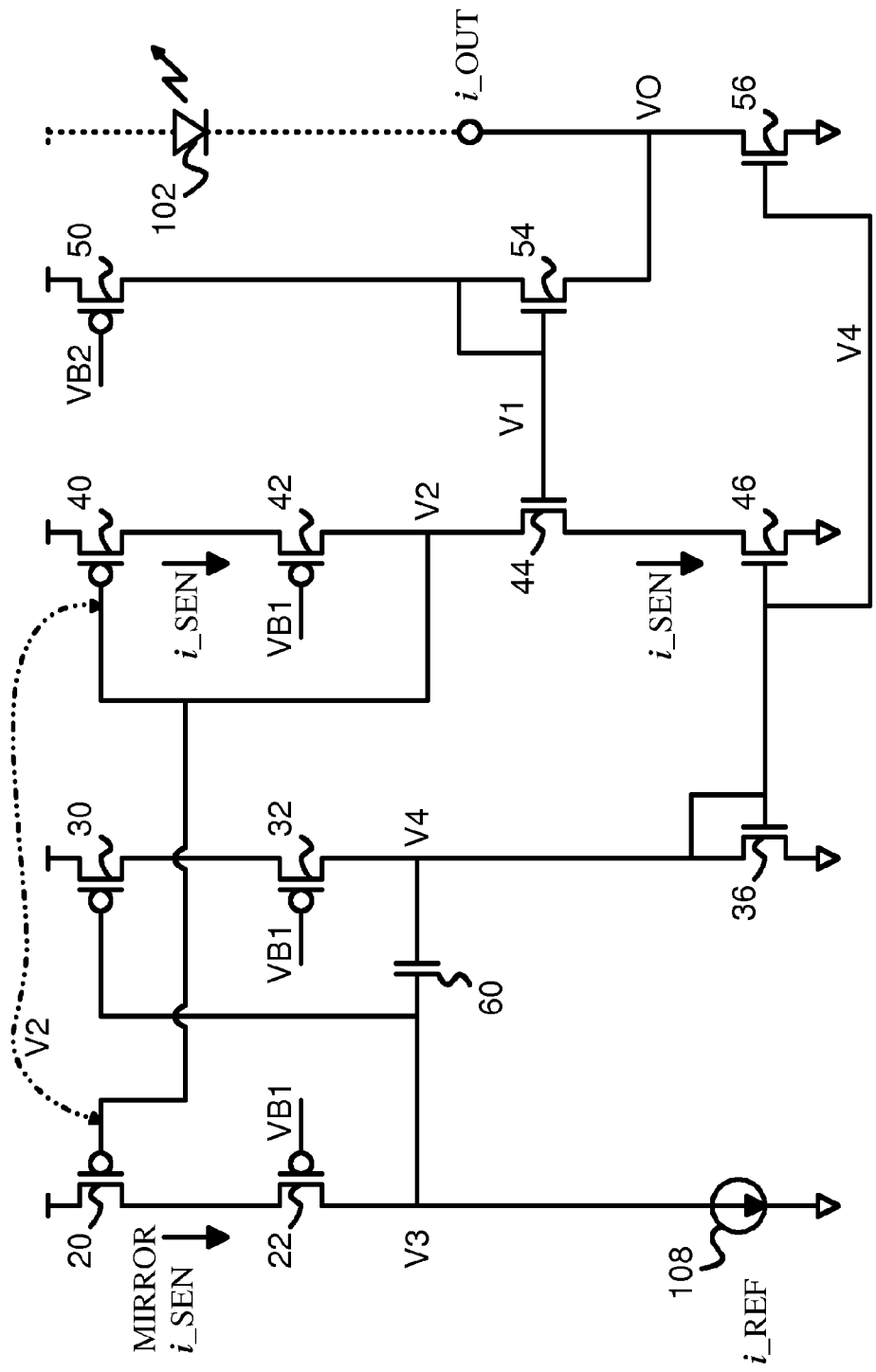

In FIG. 4B, transistors 20, 40, 22, 42 form a cascode current mirror source. The current through sense-mirror source transistor 40 is mirrored to reference source transistor 20. The increased sense current i_SEN through sense-mirror tail transistor 46 is also pulled through sense-mirror middle transistor 42 and sense-mirror source transistor 40, causing V2 to drop slightly to increase the current through transistors 40, 42. The lower V2 is applied to the gate of reference source transistor 20, causing sense current i_SEN to be mirrored to reference source transistor 20 to generate mirrored sense current MIRROR i_SEN.

Figure 4C:
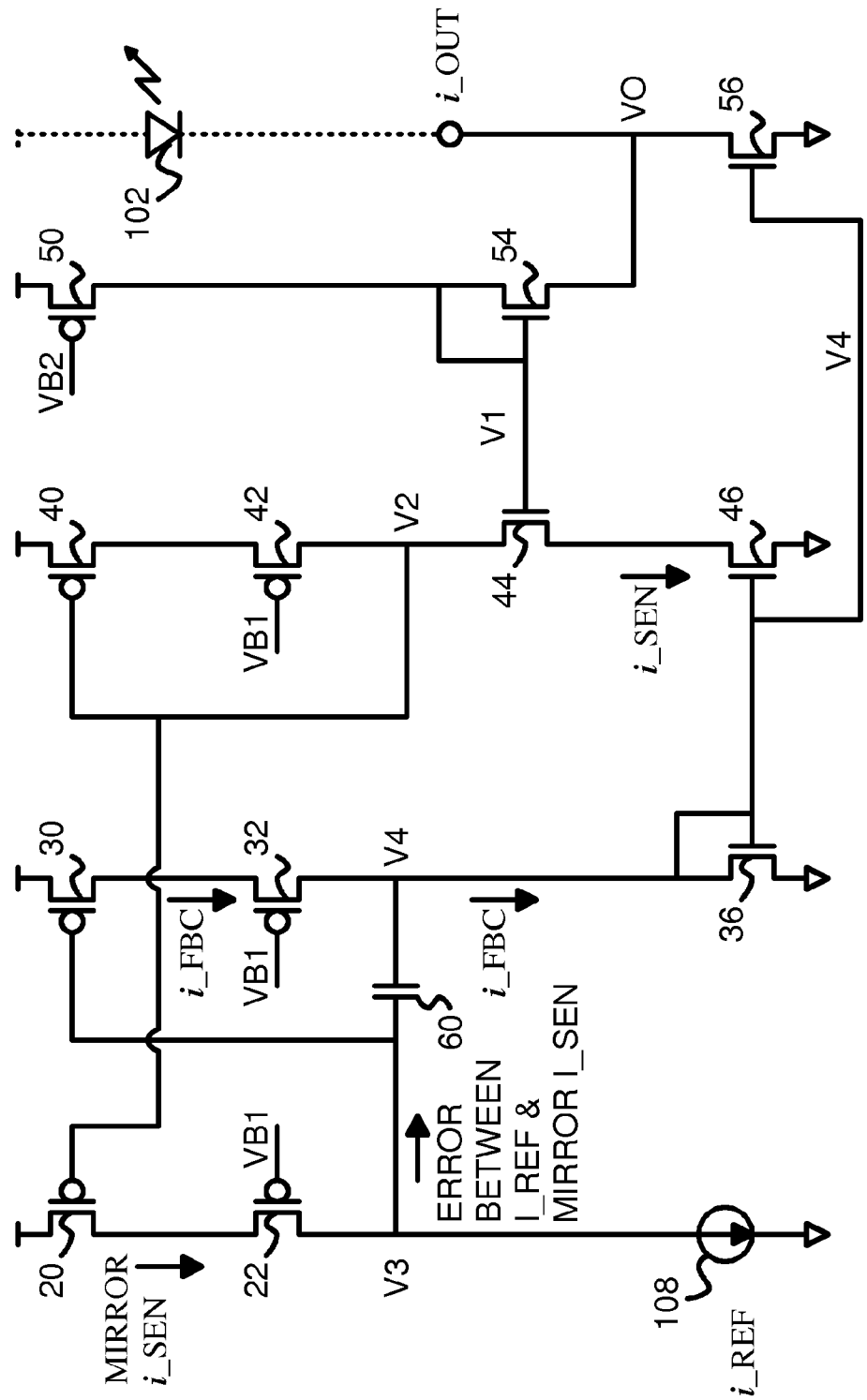

In FIG. 4C, the larger mirrored sense current flowing through reference source transistor 20 flows through reference middle transistor 22 and onto error-storing capacitor 60, since reference current source 108 is a fixed current source that does not allow for variation in the reference current i_REF. The error or difference between the mirrored sense current and reference current is stored as charge on error-storing capacitor 60.

Voltage V3 increases as error-storing capacitor 60 is charged by the excess mirrored sense current. The higher V3 applied to the gate of feedback source transistor 30 reduces the feedback compensation current i_FBC through feedback middle transistor 32. Feedback middle transistor 32 is a cascode transistor that can have the same size and bias voltages as reference middle transistor 22 and sense-mirror middle transistor 42.

Figure 4D:
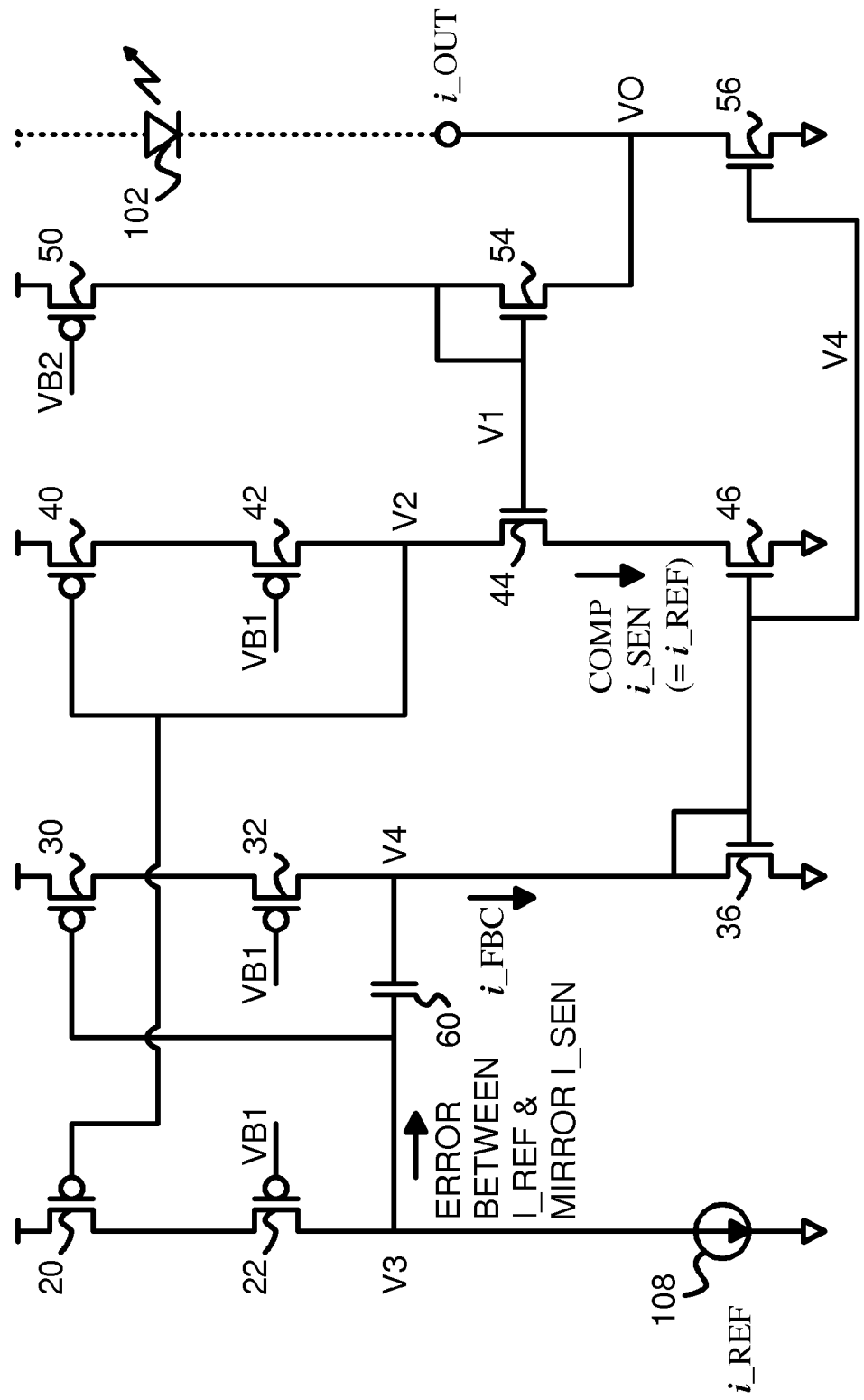

In FIG. 4D, the lower feedback compensation current i_FBC flows through feedback-driving transistor 36, causing its gate and drain to lower to reduce its current drive. Thus voltage V4 to the gate of output transistor 56 is lowered, reducing the output current to compensate for the sudden increase in output current.

As V4 is lowered, the current through sense-mirror tail transistor 46 is also reduced. The mirrored sense current through sense-mirror tail transistor 46 is thus compensated for the sensed error so that the tail current through sense-mirror tail transistor 46 is equal to i_REF. Once there is any error between this sensed current and i_REF, the feedback current will compensate it.

Figure 4E:
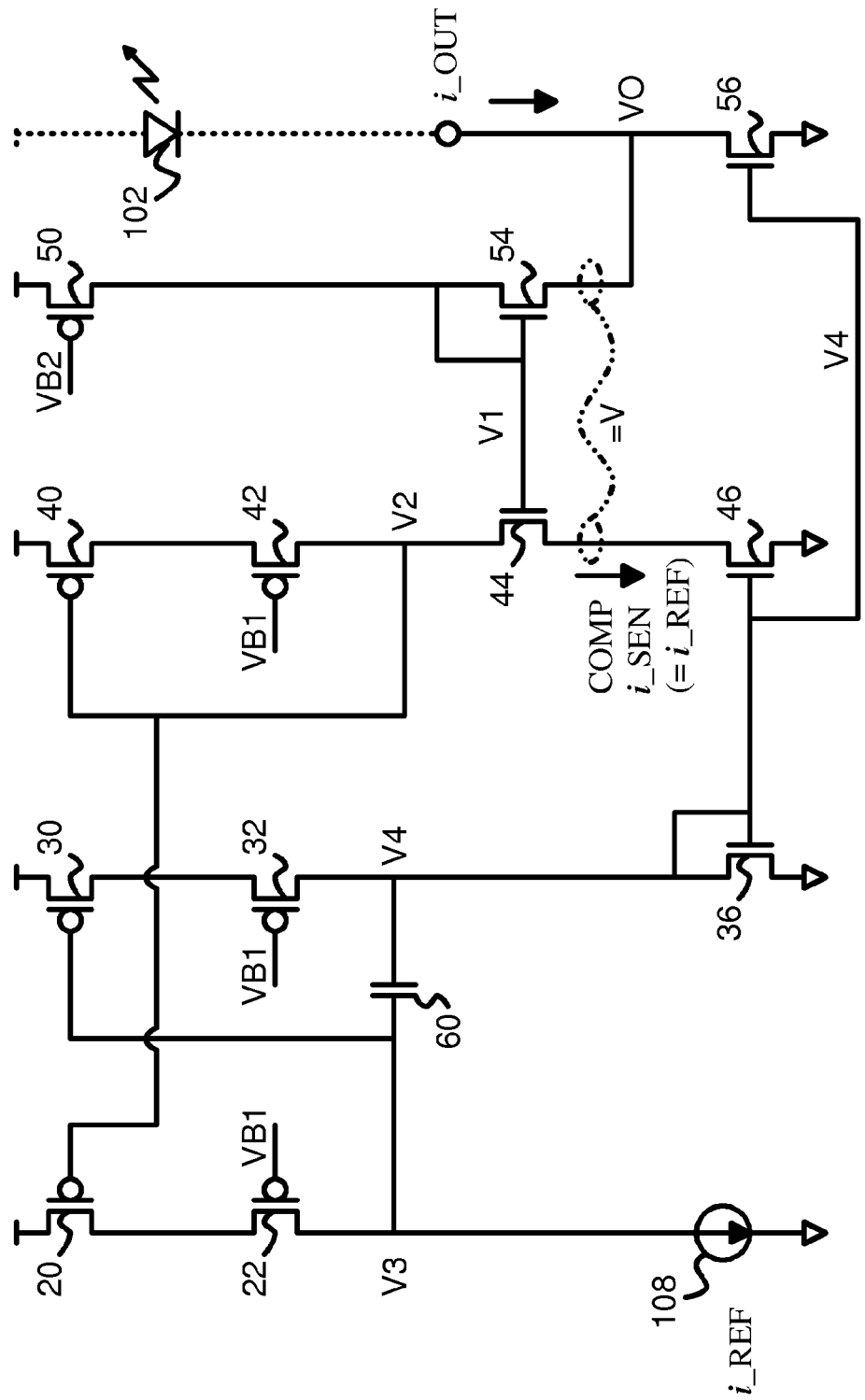

In FIG. 4E, since the gate/source/drain voltage of sense-mirror tail transistor 46 and output transistor 56 are the same, the output current of transistor 56 is adjusted back to a constant value because the current of transistor 46 is adjusted to be the same as i_REF. A similar but inverse mechanism occurs when the output current suddenly is reduced.

Figure 5:
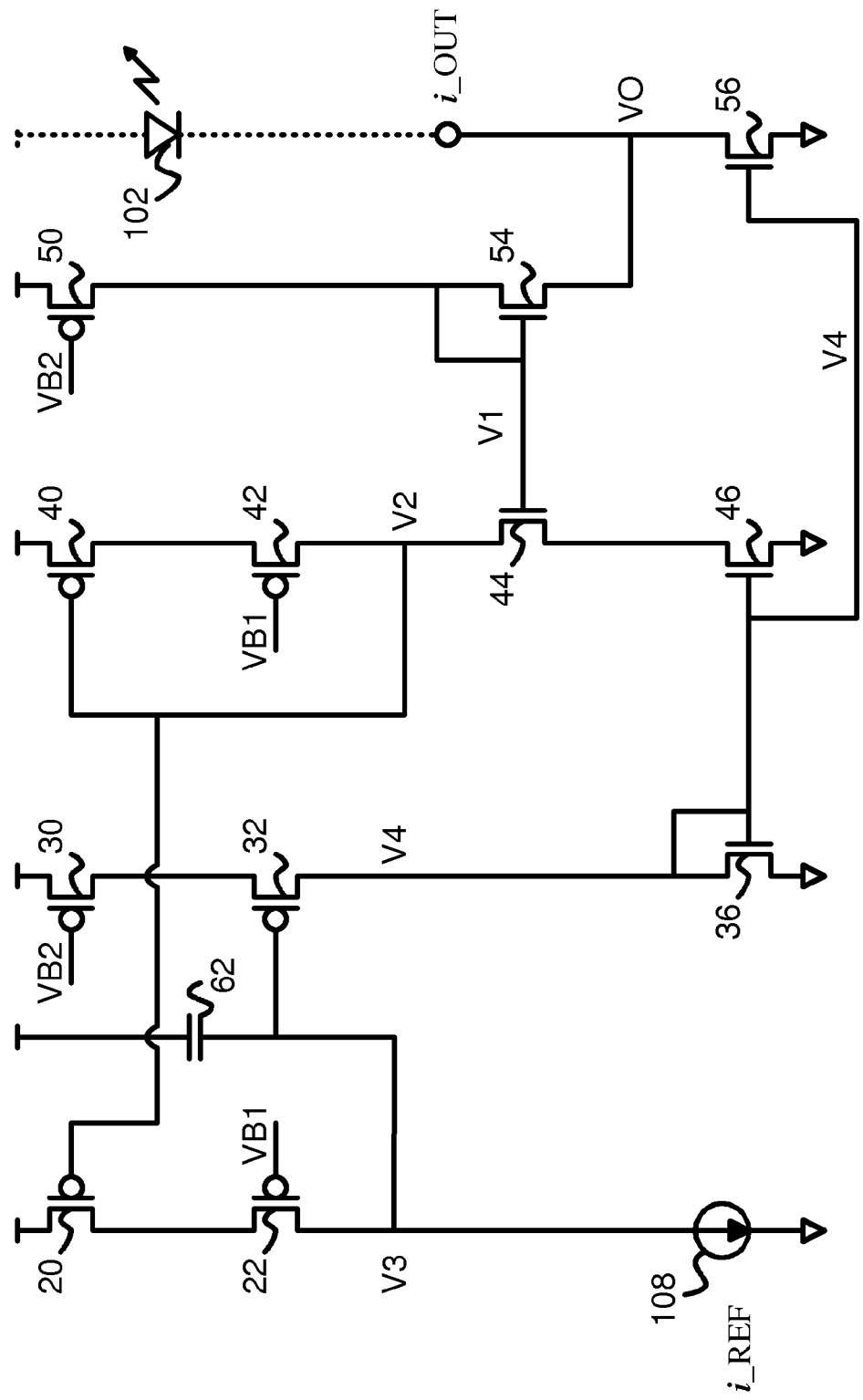
FIG. 5 is an alternative sensing and compensating circuit.

FIG. 5 is an alternative sensing and compensating circuit. The varying voltage V3 is applied to feedback middle transistor 32 rather than to feedback source transistor 30. In this alternative, a bias voltage drives the gate of feedback source transistor 30 rather than feedback middle transistor 32.

The gate of feedback source transistor 30 is driven by second bias voltage VB2 rather than by V3. The gate of feedback middle transistor 32 is not a fixed bias voltage but is directly connected to V3. Error-storing capacitor 62 is connected between V3 and the fixed power-supply VDD.

Variations in V3 adjust the current through feedback middle transistor 32, causing the node between feedback source transistor 30 and feedback middle transistor 32 to vary in voltage, causing the negative feedback compensation current i_FBC to vary. Feedback middle transistor 32 acts as a source follower, which may ease compensation.

Figure 6:
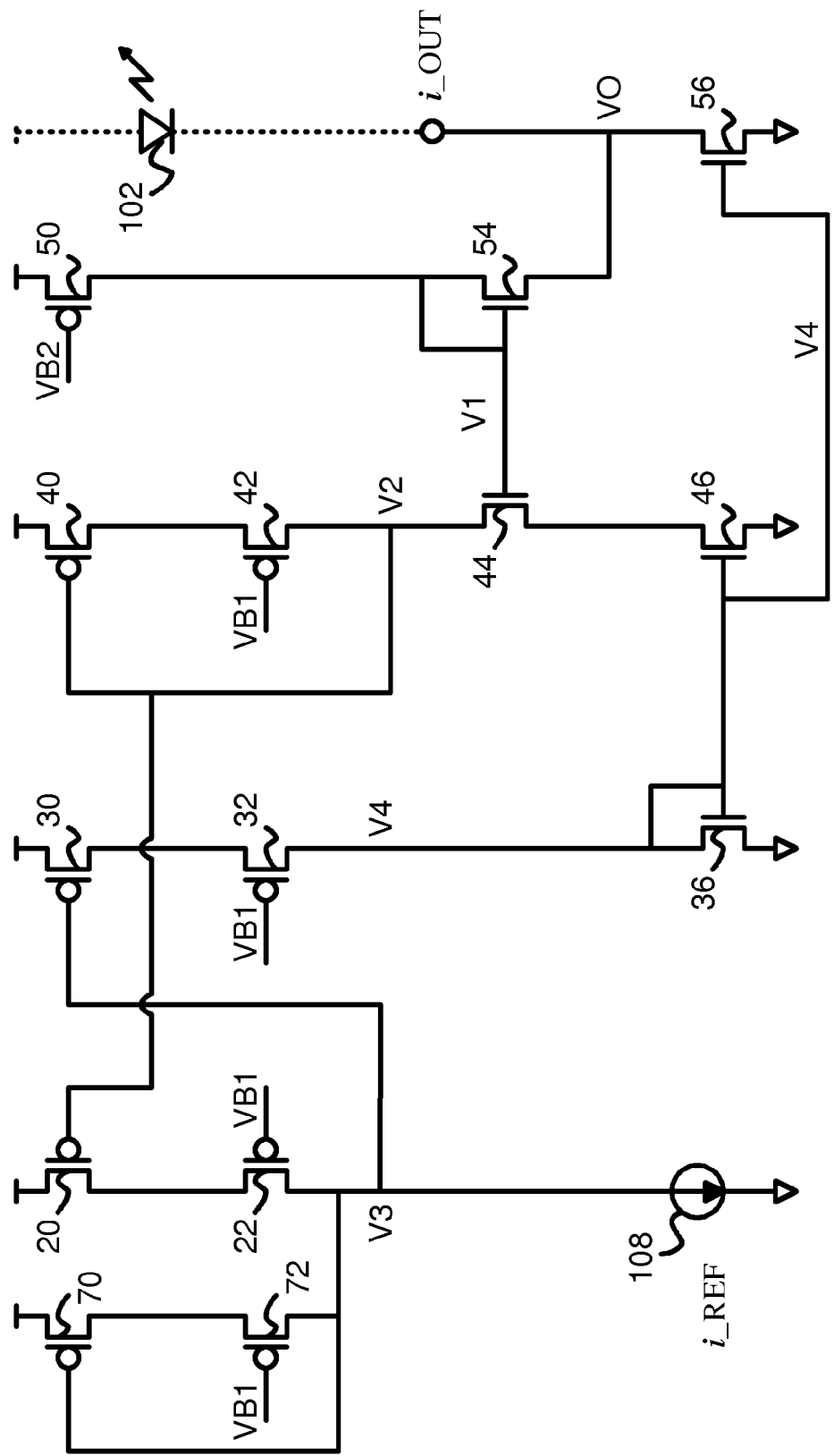
FIG. 6 is another alternative circuit without an error-storing capacitor.

FIG. 6 is another alternative circuit without an error-storing capacitor. Voltage V3 directly drives the gate of feedback source transistor 30.

A second leg of second source transistor 70 and second reference middle transistor 72 are in parallel with the leg of reference source transistor 20 and feedback source transistor 30. However, while the gate of second reference middle transistor 72 is biased by bias voltage VB1, the gate of second source transistor 70 is driven by V3 while the gate of reference source transistor 20 is driven by V2.

The current from reference current source 108 can be double the reference current of other embodiments, or 2*i_REF.

The current through transistor 70 is 2*i_REF minus the current of transistor 22. If the current through transistor 20 is i_REF−i_ERROR, the current through transistor 70 is i_REF+i_ERROR. Since transistors 70, 30 and 72, 32 form the cascode current mirror source, the current through transistor 30 is the current through transistor 70, which is i_REF+i_ERROR. This current is used to compensate the current of transistors 46 and 56. Since all of the paths use current mirror sources without any compensation capacitors, the settling time may be fast with this embodiment

ALTERNATE EMBODIMENTS

Several other embodiments are contemplated by the inventors. For example, various combinations of the alternative embodiments are possible. Error-storing capacitor 60 could have it's back terminal connected to VDD or to ground rather than to node V4. Parasitic and gate capacitances could reduce the size of error-storing capacitor 60 or eliminate it. Various ratios of transistor sizes could be used, or exact matching of transistor sizes, shapes, and orientations. The output current may be at least ten times larger than the small sense current through sensing transistor 54.

While n-channel transistors have been shown, the circuits could be flipped over and p-channel transistors substituted. The LED could be external to the circuit or they could be integrated together.

N-channel transistors have been shown. The substrate or bulk connections may be tied to the highest voltage, such as VDD or VCC, or to a substrate or back-bias voltage, or to the transistor sources.

The current source could be implemented as n-channel transistors having gates receiving a fixed voltage. Bias voltages could be generated by bias generators such as a resistor divider or a series of transistors.

Various theories of operation have been presented to try to explain operation. These theories are approximations of real, often complex, physical behaviors. These theories may be incorrect, although useful for designing driver circuits. The invention is not limited by these theories and does not depend on these theories being correct.

The circuit designer may choose resistors, capacitors, transistors, and other components to have a ratio that produces the desired voltages. While Complementary-Metal-Oxide-Semiconductor (CMOS) transistors have been described, other transistor technologies and variations may be substituted, and materials other than silicon may be used, such as Galium-Arsinide (GaAs) and other variations. DMOS, LDMOS, and diffusion-enhanced transistors may be used. Bipolar transistors could also be used, such as for output transistor 56.

Timings may be adjusted by adding delay lines or by controlling delays in leading-edge blocking units. Pulse generators could also be added. The outputs or control signals may be swapped to add an inversion. Inverting and non-inverting inputs may be swapped and the polarity of the output reversed.

Separate power supplies and grounds may be used for some components. The bulk or substrate nodes may be tied to power for p-channel transistors, and to ground for n-channel transistors, or a substrate bias generate be used to generate bulk voltages. Various filters could be added. Active low rather than active high signals may be substituted. The signals applied to the gates of p-channel and n-channel transistors may be switched to power or ground to power down the circuit.

The bias voltages may be fixed, or may be adjustable, such as to track temperature, process, or power-supply voltage. The reference current i_REF from reference current source 108 may likewise be fixed, or may be adjustable to track temperature, process, or supply voltage. Band-gap references may be used.

While positive currents have been described, currents may be negative or positive, as electrons or holes may be considered the carrier in some cases. Source and sink currents may be interchangeable terms when referring to carriers of opposite polarity. Currents may flow in the reverse direction.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An error-sensing current-compensating driver circuit comprising:
   an output transistor having a gate driven by a gate node to generate an output current on an output node;
   a sense-source transistor that generates a first source current;
   a sensing transistor that conducts the first source current to the output node, wherein a gate of the sensing transistor and a node between the sense-source transistor and the sensing transistor are connected together as a first mirror node;
   a sense mirror transistor conducting current between a second mirror node and a tail node in response to a gate receiving the first mirror node;
   a sense-mirror middle transistor for conducting a current to the second mirror node;
   a sense-mirror tail transistor for conducting current from the tail node;
   a reference source transistor for conducting a mirrored sense current in response to a gate receiving the second mirror node;
   a reference current source for generating a reference current;
   an error-storing capacitor having a combining node that stores as charge a difference between the reference current and the mirrored sense current;
   a feedback source transistor having a gate receiving the combining node, for generating a feedback compensation current to the gate node; and
   a feedback-driving transistor having a gate and a drain connected to the gate node, wherein the feedback compensation current flows through the feedback-driving transistor to generate a voltage of the gate node to the output transistor.

2. The error-sensing current-compensating driver circuit of claim 1 wherein the sense-mirror tail transistor has a gate connected to the gate node of the output transistor.

3. The error-sensing current-compensating driver circuit of claim 2 further comprising:
   a sense-mirror source transistor for conducting current to the sense-mirror middle transistor.

4. The error-sensing current-compensating driver circuit of claim 3 wherein the sense-mirror source transistor has a gate connected to the second mirror node.

5. The error-sensing current-compensating driver circuit of claim 1 further comprising:
   a feedback middle transistor for conducting the feedback compensation current from the feedback source transistor to the gate node.

6. The error-sensing current-compensating driver circuit of claim 5 wherein a second terminal of the error-storing capacitor is connected to the gate node.

7. The error-sensing current-compensating driver circuit of claim 4 wherein a second terminal of the error-storing capacitor is connected to a fixed voltage.

8. The error-sensing current-compensating driver circuit of claim 7 wherein a second terminal of the error-storing capacitor is connected to a power-supply voltage.

9. The error-sensing current-compensating driver circuit of claim 5 wherein gates of the feedback middle transistor, and the sense-mirror middle transistor are driven by a first bias voltage.

10. The error-sensing current-compensating driver circuit of claim 9 further comprising:
    a reference middle transistor having a gate driven by the first bias voltage, for conducting the mirrored sense current to the combining node.

11. The error-sensing current-compensating driver circuit of claim 10 wherein a gate of the sense-source transistor is connected to a second bias voltage;
    wherein the second bias voltage is higher than the first bias voltage.

12. The error-sensing current-compensating driver circuit of claim 1 further comprising:
    a Light-Emitting Diode (LED) connected to the output node and illuminated when the output current is drawn through the LED.

13. A current driver comprising:
    an output transistor having a gate node that controls an output current conducted from an output node;
    a sensing transistor having a gate and a drain connected together as a first mirror node, and a source connected to the output node;
    a sense-source transistor having a source connected to the first mirror node;
    a sense mirror transistor having the first mirror node as a gate, and a second mirror node as a drain, and a tail node as a source;
    a sense-mirror tail transistor having the gate node as a gate, and the tail node as a drain, and a grounded source;
    a sense-mirror middle transistor receiving a first bias voltage on a gate, for conducting current between a first source node and the second mirror node;
    a sense-mirror source transistor receiving the second mirror node on a gate, for conducting current from a power supply node to the first source node;
    a reference source transistor receiving the second mirror node on a gate that controls conduction from the power supply node to a second source node;
    a reference middle transistor receiving the first bias voltage on a gate, for conducting a mirrored sense current between a second source node and a third node;
    a reference current source for sinking a reference current from the third node, the reference current not varying with the output current of the output transistor;

an error-storing capacitor having a first terminal connected to the third node, for being charged by a difference between the reference current and the mirrored sense current from the reference middle transistor;
a feedback source transistor and a feedback middle transistor having channels in series between the power supply node and the gate node, the channels for conducting a feedback current;
wherein the feedback source transistor has the third node on a gate;
wherein the feedback middle transistor has the first bias voltage on a gate; and
a feedback-driving transistor having a drain and a gate connected to the gate node, and a grounded source.

14. The current driver of claim 13 wherein a second terminal of the error-storing capacitor is connected to the gate node.

15. The current driver of claim 13 wherein a second terminal of the error-storing capacitor is connected to the power supply node.

16. The current driver of claim 13 wherein a gate of the sense-source transistor is driven by a second bias voltage that is higher than the first bias voltage.

17. The current driver of claim 13 wherein the output transistor has a source connected to a ground and a drain connected to the output node.

18. The current driver of claim 13 wherein the feedback-driving transistor, the sense mirror transistor, the sense-mirror tail transistor, the sensing transistor, and the output transistor are n-channel transistors;
wherein the reference source transistor, the reference middle transistor, the feedback source transistor, the feedback middle transistor, the sense-mirror source transistor, the sense-mirror middle transistor, and the sense-source transistor are p-channel transistors.

19. A driver comprising:
output transistor means for conducting an output current from an output node in response to an output gate node;
sensing transistor means for conducting a small current from a first sense node to the output node in response to a gate connected to the first sense node;
sense-source transistor means for sourcing the small current to the first sense node;
wherein the output current is at least ten times larger than the small current;
sense mirror transistor means for conducting a sensed current from a second sense node to a third sense node in response to a gate connected to the first sense node;
sense-mirror source means for sourcing the sensed current to the second sense node;
sense-mirror tail transistor means for conducting the sensed current from the third sense node in response a gate connected to the output gate node;
reference source transistor means for conducting a mirrored sense current to a fourth sense node in response to a gate receiving the second sense node;
reference middle transistor means for conducting the mirrored sense current from the fourth sense node to a storage node;
reference current source means for conducting a fixed reference current from the storage node;
error-storing capacitor means for storing charge from the storage node;
feedback source transistor means for conducting a feedback current in response to a gate receiving the storage node;
feedback middle transistor means for conducting the feedback current in response to a bias voltage;
wherein the feedback source transistor means and the feedback middle transistor means are connected in series between a power supply and the output gate node to conduct the feedback current from the power supply to the output gate node; and
feedback-driving transistor means for conducting the feedback current to a ground supply, the feedback-driving transistor means having a gate and a drain connected together and to the output gate node.

20. The driver of claim 19 further comprising:
a load connected to the output node;
wherein the output current minus the small current flows through the load;
wherein the load is a Light-Emitting Diodes (LED), a liquid crystal display (LCD), a monitoring device, a motor, or an actuator.

* * * * *